United States Patent [19]

Flickinger

[11] 3,723,896

[45] Mar. 27, 1973

[54] AMPLIFIER SYSTEM

[76] Inventor: Daniel N. Flickinger, 40 South Oviatt Street, P.O. Box 628, Hudson, Ohio

[22] Filed: Dec. 28, 1970

[21] Appl. No.: 101,494

[52] U.S. Cl. ..................330/30 R, 330/30 D, 330/24

[51] Int. Cl. ..................H03f 3/68

[58] Field of Search ..................330/30 R, 30 D, 24

[56] References Cited

UNITED STATES PATENTS

| | | | |
|---|---|---|---|
| 3,562,660 | 2/1971 | Pease | 330/30 D |
| 3,569,849 | 3/1971 | Cassidy et al. | 330/30 D X |
| 3,599,015 | 8/1971 | Ulrick | 330/30 D X |
| 3,622,902 | 11/1971 | Thomas | 330/30 D |
| 3,551,851 | 12/1970 | Engel | 332/9 |
| 3,546,610 | 12/1970 | Checinski | 330/30 R |
| 3,094,673 | 6/1963 | Maupin | 330/30 R X |

*Primary Examiner*—Nathan Kaufman

*Attorney*—Woodling, Krost, Granger & Rust

[57] ABSTRACT

A solid state amplifier system is disclosed consisting of a driver stage having a differential input coupled to a single ended complementary symmetry output stage. The amplifier system is coupled in a manner which results in a wideband amplifier capable of a high power output at low noise and distortion. The amplifier system is temperature compensated and economical to produce. The foregoing abstract is merely a resume of one general application, is not a complete discussion of all principles of operation or applications, and is not to be construed as a limitation on the scope of the claimed subject matter.

6 Claims, 4 Drawing Figures

INVENTOR.
DANIEL N. FLICKINGER
BY Woodling, Krost, Granger and Rust
ATTORNEYS.

INVENTOR.
DANIEL N. FLICKINGER
BY Woodling, Krost, Granger and Rust
ATTORNEYS.

AMPLIFIER SYSTEM

BACKGROUND OF THE INVENTION

In the past development of solid state amplifier systems, attempts have been made to produce a versatile wideband amplifier having a high power output with low distortion. However, the prior art amplifier systems that have claimed to have met these objectives, have either been unstable or expensive. Some of the most apparent difficulties have been encountered in the development of a power amplifier system having a differential input and a single ended output.

Therefore, an object of this invention is to provide an amplifier system that is versatile yet economical.

Another object of this invention is to produce an amplifier system capable of delivering a high power output over a wide range of frequencies with low noise and distortion.

Another object of the invention is to produce an amplifier system with a differential input having a high common mode rejection.

Another object of the invention is to produce an amplifier system with a single ended output which is temperature compensated.

Another object of the invention is to produce an amplifier system which is stable.

SUMMARY OF THE INVENTION

The invention may be incorporated in an amplifier system, comprising, in combination, a driver stage, an output stage, power source means, said driver stage including, first and second transistors, first and second driver stage output means, means connecting the emitter of said first transistor to said power source means, means connecting the collector of said first transistor to said first driver stage output means, means connecting the collector of said second transistor to said power source means, means connecting the emitter of said second transistor to said second driver stage output means, means connecting an input to the bases of said first and second transistors, and said output stage including, an output, third and fourth transistors having emitter and collector means, means connecting one of said means of said third and fourth transistors to said power source means, means connecting the other of said means of said third and fourth transistors to said output, and coupling means connecting said first and second driver stage output means to the bases of said third and fourth transistors resulting in a cooperation between said driver stage and said output stage.

Other objects and a fuller understanding of the invention may be had by referring to the following description and claims, taken in conjunction with the accompanying drawing.

DESCRIPTION

Figure 1:
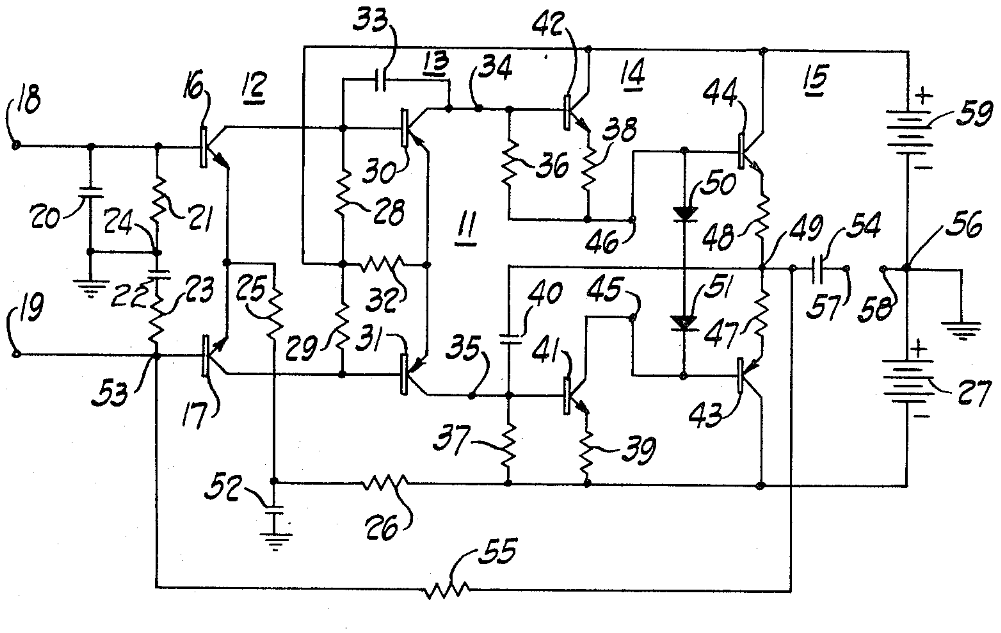
FIG. 1 illustrates a schematic diagram of a four-stage amplifier system embodying the invention.

The preferred embodiment, FIG. 1, shows an amplifier system 11 including a differential input stage 12, a pre-driver stage 13, a driver stage 14 and an output stage 15. The differential input stage 12 is composed of two emitter coupled transistors 16 and 17. The non-inverting input 18 is directly connected to the base of transistor 16 and the inverting input 19 is directly connected to the base of transistor 17. The optional impedance network connected between inputs 18 and 19 is composed of capacitor 22, and resistors 21 and 23. This network eliminates input drift while retaining a high common mode rejection of the differential input stage 12. Capacitor 20 shunts unwanted high frequency signals from the base of transistor 16. The emitters of transistors 16 and 17 are connected to the negative terminal of power source 27 through resistors 25 and 26. Capacitor 52 bypasses high frequency signals around resistor 26 and power source 27. The collector of transistor 16 is connected to the positive terminal of power source 59 through resistor 28. In addition, the collector of transistor 16 is directly connected to the base of a transistor 30. Similarly, the collector of transistor 17 is connected to the positive terminal of power source 59 through resistor 29 and directly connected to the base of transistor 31.

The pre-driver 13 stage includes the transistors 30 and 31. The emitters of transistors 30 and 31 are connected to the positive terminal of power source 59 through resistor 32. The network consisting of resistors 28, 29 and 32 furnishes the proper operating bias for transistors 30 and 31 and insures their low distortion operation. A feedback capacitor 33 connected from the collector to the base of transistor 30 aids in the high frequency stability of the stage. The collectors of transistors 30 and 31 are connected to the driver stage input terminals 34 and 35, respectively.

The driver stage 14 is composed of a first transistor 41 and a second transistor 42. The emitter of the first transistor 41 is connected to the negative terminal of power source 27 through an emitter resistor 39. The base of first transistor 41 is connected to the driver stage input terminal 35 and is also connected to the negative terminal of power source 27 through resistor 37. The collector of first transistor 41 is directly connected to a driver stage first output terminal 45. The collector of second transistor 42 is directly connected to the positive terminal of power source 59. The emitter of second transistor 42 is connected through an emitter resistor 38 to a driver stage second output terminal 46. The base of second transistor 42 is connected directly to the driver stage input terminal 34, and is also connected through resistor 36 to the driver stage second output terminal 46. The resistor networks composed of resistors 37 and 39 and resistors 36 and 38 supply bias for the first and second transistors 41 and 42, respectively.

The output stage 15 consists of a third transistor 43 and a fourth transistor 44. The emitters of the third and fourth transistors 43 and 44 are connected to the single ended output 49 of stage 15 through emitter resistors 47 and 48, respectively. The collector of third transistor 43 is directly connected to the negative terminal of power source 27, whereas the collector of fourth transistor 44 is directly connected to the positive terminal of power source 59. The bases of third and fourth transistors 43 and 44 are interconnected by diodes 50 and 51. These diodes provide operating bias for the third and fourth transistors 43 and 44 by virtue of their forward voltage drop. Diodes 50 and 51 also provide temperature compensation for the third and fourth transistors 43 and 44. The base of third transistor 43 is directly connected to the driver stage first output terminal 45, and the base of fourth transistor 44 is directly connected to the driver stage second output terminal 46. The output 49 is connected to connection 53 on the inverting input 19 through a feedback resistor 55. The value of the feedback resistor 55 controls the overall gain of the amplifier system. The power sources 27, 59 contain a grounded tap 56. This grounded tap is connected to a grounded terminal 58 which serves as a return path for power output from an output terminal 57. Output terminal 57 is connected to the output 49 through output capacitor 54. Output capacitor 54 blocks any DC offsets generated within the circuit due to differentials in emitter-base voltage drops. By eliminating these unwanted DC offsets at the output terminal 57, distortion is reduced.

Figure 2:
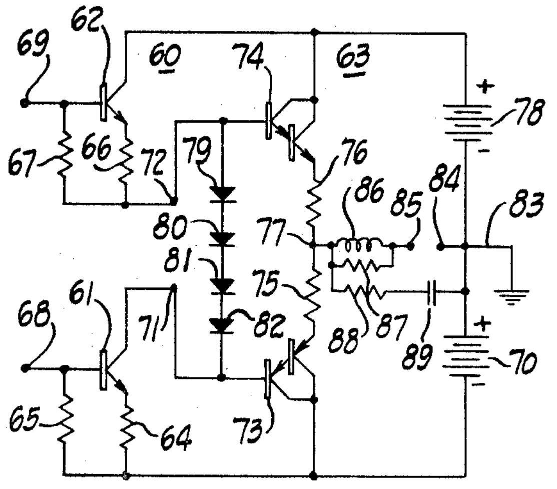
FIG. 2 is a modification of the final two stages of FIG. 1.

FIG. 2 represents a driver stage 60 connected to an output stage 63 suitable for use with the differential input stage 12 and the pre-driver stage 13 of amplifier system 11 shown in FIG. 1. The driver stage 60 is composed of first and second transistors 61 and 62, respectively. The emitter of first transistor 61 is connected to the negative terminal of a power source 70 through an emitter resistor 64. The base of first transistor 61 is directly connected to the driver stage input terminal 68 and connected to the negative terminal of power source 70 through a resistor 65. The collector of first transistor 61 is directly connected to a driver stage first output terminal 71. The collector of second transistor 62 is directly connected to the positive terminal of a power source 78. The emitter of second transistor 62 is connected through an emitter resistor 66 to the driver stage second output terminal 72. The base of second transistor 62 is directly connected to the driver stage input terminal 69. A resistor 67 interconnects the driver stage input terminal 69 and the driver stage second output terminal 72. The resistance networks composed of resistors 64 and 65 and resistors 66 and 67 furnish proper bias for the first and second transistors 61 and 62.

The output stage 63 includes two transistors in a Darlington pair 73, in complementary symmetry with two transistors in a Darlington pair 74. The emitters of the Darlington pairs 73 and 74 are connected to a single ended output 77 of output stage 63 through emitter resistors 75 and 76. The collectors of the Darlington pair 73 are directly connected to the negative terminal of power source 70, and the collectors of the Darlington pair 74 are connected to the positive terminal of power source 78. The bases of the Darlington pairs 73 and 74 are interconnected through a diode string consisting of diodes 79, 80, 81 and 82. Since Darlington pairs arranged in complementary symmetry require a greater degree of bias separation than single transistors in complementary symmetry, four diodes are used in FIG. 2 whereas only two diodes are used in FIG. 1. The input base of the Darlington pair 73 is directly connected to the driver stage first output terminal 71 and the input base of the Darlington pair 74 is directly connected to the driver stage second output terminal 72. The output 77 is connected to the output terminal 85 through an output inductance 86. Output resistor 87 shunts output inductance 86. The power sources 70, 78 contain a grounded tap 83 which is connected to a grounded terminal 84. This grounded terminal 84 acts as a return path for output terminal 85. A resistor-capacitor network composed of a resistor 88 and a capacitor 89, maintains the output 77 near ground potential during the quiescent conditions of the amplifier system.

Figure 3:
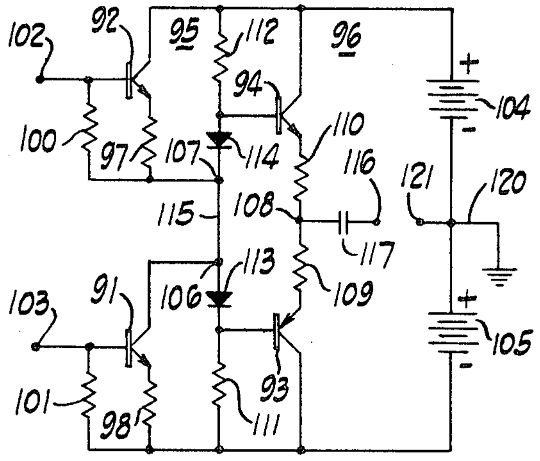
FIG. 3 is another modification of the final two stages of FIG. 1.

FIG. 3 shows a driver stage 95 and output stage 96 which is also suitable for use with the differential input stage 12 and the pre-driver stage 13 of the amplifier system 11 shown in FIG. 1. The driver stage 95 includes a first transistor 91 and a second transistor 92. The emitter of first transistor 91 is connected through an emitter resistor 98 to the negative terminal of a power source 105. The base of the first transistor 91 is directly connected to a driver stage input terminal 103 and is also connected to the negative terminal of a power source 105 through a resistor 101. The collector of first transistor 91 is directly connected to a driver stage first output terminal 106. The emitter of second transistor 92 is connected to a driver stage second output terminal 107 through an emitter resistor 97. The base of the second transistor 92 is connected to a driver stage input terminal 102 and is also connected through a resistor 100, to the driver stage second output terminal 107. The collector of second transistor 92 is directly connected to the positive terminal of a power source 104.

The output stage 96 contains a third transistor 93 and a fourth transistor 94. The emitters of the third and fourth transistors 93 and 94 are connected to the output 108 of output stage 96 through emitter resistors 109 and 110, respectively. The collector of third transistor 93 is connected to the negative terminal of power source 105, and the collector of fourth transistor 94 is connected to the positive terminal of power source 104. The bases of third and fourth transistors 93 and 94 are connected to their respective collectors through resistors 111 and 112. The base of the third transistor 93 is connected to the driver stage first output terminal 106, through diode 113. The base of the fourth transistor 94 is connected to the driver stage second output terminal 107 through diode 114. The driver stage first and second output terminals 106, 107 are interconnected by connection 115. The output 108 is connected through output capacitor 117 to the output terminal 116. As in the previous circuits shown in FIGS. 1 and 2, the power sources 104, 105 contain a grounded tap 120 which is connected to a grounded terminal 121. Again the grounded terminal 121 acts as a return path for the output terminal 116.

Figure 4:
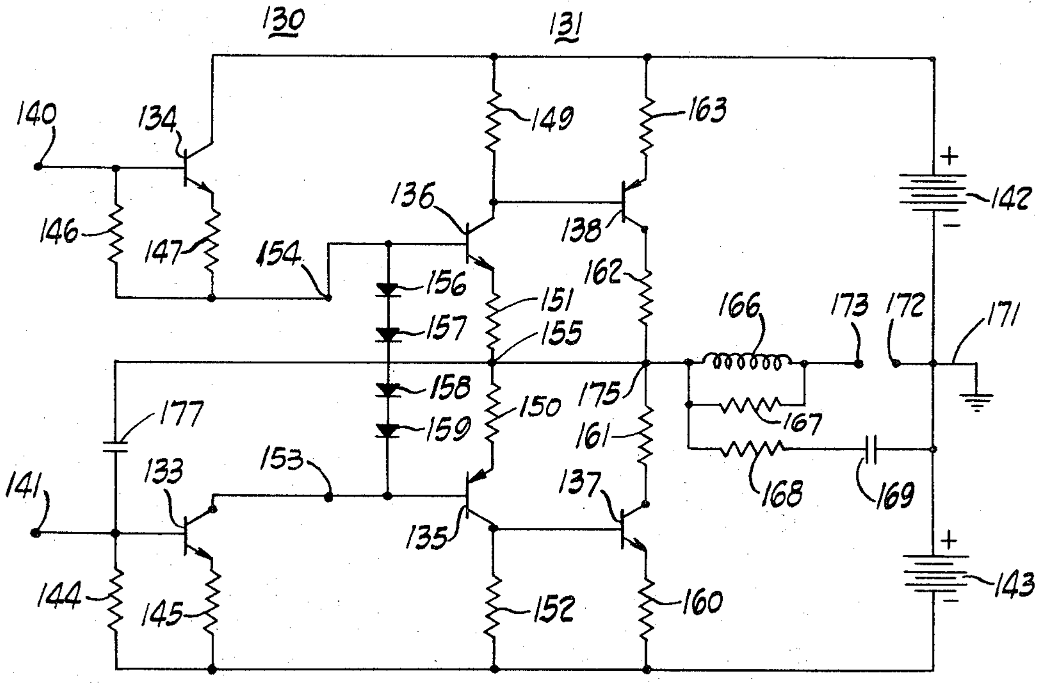
FIG. 4 is another modification of the final two stages of FIG. 1.

FIG. 4 illustrates a driver stage 130 and an output stage 131 which is compatible for use with the differential input stage 12 and the pre-driver stage 13 of the amplifier system 11 shown in FIG. 1. The driver stage 130 includes a first transistor 133 and a second transistor 134. The emitter of the first transistor 133 is connected to the negative terminal of a power source 143 through a resistor 145. The base of the first transistor 133 is connected to a driver stage input terminal 141 and also connected to the negative terminal of the power source 143 through a resistor 144. The collector of the first transistor 133 is directly connected to a first driver stage output terminal 153. The base of the second transistor 134 is directly connected to a driver stage input terminal 140. The emitter of the second transistor 134 is connected to a second driver stage output terminal 154 through an emitter resistor 147. The base of the second transistor 134 is also connected to the second driver stage output terminal 154 through a resistor 146. The collector of the second transistor 134 is connected directly to the positive terminal of a power source 142.

The output stage 131 includes third, fourth, fifth and sixth transistors 135, 136, 137 and 138, respectively. Resistors 150 and 151 interconnect the emitters of transistors 135 and 136 through a terminal 155. The collectors of transistors 135 and 136 are connected to their respective power sources through resistors 152 and 149, respectively. The base of the third transistors 135 is connected directly to the first driver stage output terminal 153 and the base of fourth transistor 136 is connected directly to the second driver stage output terminal 154. The bases of the third and fourth transistors 135 and 136 are interconnected by four diodes 156, 157, 158 and 159. The collectors of the fifth and sixth transistors 137 and 138 are interconnected through resistors 161 and 162, with a terminal 175 therebetween. The emitters of the fifth and sixth transistors 137 and 138 are connected to the negative and positive terminals of power sources 143 and 142 through resistors 160 and 163, respectively.

A parallel network of an output inductance 166 and output resistor 167 interconnects the terminal 175 with the output terminal 173. The power sources 142 and 143, have a grounded tap 171 which is connected to a grounded terminal 172. A load will be connected between terminals 172 and 173. A series resistance-capacitance network composed of resistor 168 and capacitor 169 interconnects the terminal 175 with the grounded tap 171.

Finally, jumper 180 interconnects the terminal 175 with terminal 155. This terminal is connected back to the base of transistor 133 through the feedback capacitor 177.

OPERATION

The amplifier system 11 as shown in FIG. 1 can be characterized as an amplifier having a differential input, with a single-ended output capable of delivering high power output in a wide frequency range. The amplifier system is further characterized by low noise and distortion and excellent stability. These features of this amplifier system make the amplifier extremely versatile and its low cost of production add to its desirability. The power band width of the amplifier extends typically from DC to 500 KHz with a power output limited by the supply voltage and the dissipation characteristics of the output transistors.

The input signal to the amplifier system 11 is applied between the inverting input 19 and the non-inverting input 18. Capacitor 20 acts as a shunt to high frequencies present at the non-inverting input 18 and prevents these unwanted frequencies from being amplified by transistor 16. Because of the arrangement of transistors 16 and 17, the signal at the collectors of transistors 16 and 17 is dependent only on the voltage differential between inputs 18 and 19. The network consisting of capacitor 22 and resistors 21 and 23 insures a high common mode rejection while maintaining the inputs close to ground potential during quiescent conditions of the amplifier system. When a positive voltage is applied to the non-inverting input 18, the base current of transistor 16 is increased and flows through resistors 25 and 26 to the negative terminal of power source 27. This increase in base current of transistor 16 increases the collector current of transistor 16 which flows through resistor 28. The increase current through resistor 28 raises the voltage differential between the emitter and the base of transistor 30 and results in an increase of base current in transistor 30. The increase in base current through transistor 30 increases the collector current which flows through the driver stage input terminal 34. Thus a positive input voltage applied to the non-inverting input 18 has caused an increase of current flow at driver stage input terminal 34. The operation of transistors 17 and 31 is identical to the operation of transistors 16 and 30. When a positive signal is applied at the inverting input 19, the base current through transistors 17 is increased. This increase causes an increase in collector current of transistor 17 which flows from the positive terminal of power source 59 through resistor 29 to the collector of transistor 17. The increased current through resistor 29 raises the emitter-base potential of transistor 31, and simultaneously raises the base current through transistor 31. The collector current of transistor 31 is increased resulting in an increase in current flow at the driver stage input terminal 35. The increased current flow at driver stage input terminal 35 flows through resistor 37 to the negative terminal of power source 27. This increased current through resistor 37 increases the voltage across resistor 37 raising the potential of the driver stage input terminal 35. Thus a positive voltage applied at the inverting input 19 will be amplified and cause a positive voltage increase at the driver stage input terminal 35. Similarly, a positive voltage applied to the non-inverting input 18 will be amplified and cause a positive increase in voltage at the driver stage input terminal 34. Feedback capacitor 33 is connected from the collector to the base of transistor 30 and is a high frequency negative feedback capacitor which increases the high frequency stability of the amplifier system. Similarly, the capacitor 52 eliminates high frequency voltages from developing across resistor 26 and power source 27.

The rise in voltage at the driver stage input terminal 35 increases the base current of first transistor 41. The increase in base current of first transistor 41 causes an increase in the collector current. Since the collector of first transistor 41 is directly connected through the driver stage first output terminal 45 to the base of third transistor 43, the base current of third transistor 43 is correspondingly increased. Therefore, the collector current in third transistor 43 is also increased. This results in a power output to any load connected between output terminal 57 and grounded terminal 58, with current flow from terminal 58 toward terminal 57 through the load. In the like manner, a voltage increase at driver stage input terminal 34 increases the base current of second transistor 42. This increased current in the base circuit causes the current in the collector circuit of transistor 42 to be increased which flows through the driver stage second output terminal 46 to the base circuit of fourth transistor 44. This increase in base current in fourth transistor 44 also increases the transistor 44 collector current. The collector current of the fourth transistor 44, will deliver current to any load connected between output terminal 57 and grounded terminal 58, with current flow from terminal 57 toward terminal 58 through the load. Because of the presence of output capacitor 54, there is no steady-state DC current flow through any load connected between output terminal 57 and grounded terminal 58. Only the signals applied between the differential inputs 18 and 19 will be present at the output and grounded terminals 57 and 58. Emitter resistors 38 and 39 produce degenerative feedback which increases the stability and lowers the distortion in the driver stage 14. Similarly, the emitter resistors 47 and 48 in the output circuit 15 produce sufficient degenerative feedback to make the output circuit very stable with low distortion and capable of delivering a high power output. The forward resistance of diodes 50 and 51 furnish sufficient voltage to bias the third and fourth transistors 44 and 43 This establishes a Class A or Class AB operation of the transistors 43 and 44. Because of the current-voltage characteristics of a diode, the bias voltage furnished by diodes 50 and 51 will be constant over a wide range of currents through diodes 50 and 51. In addition, since diodes have a temperature characteristic similar to the emitter base junction of a transistor, diodes 50 and 51 give compensation for temperature variations of the emitter base resistance of third and fourth transistors 43 and 44. This results in a highly temperature stable amplifier system since the output stage 15, which will be dissipating the greatest amount of heat, is temperature compensated. Capacitor 40 is a degenerative feedback capacitor from the output 49 to the base of first transistor 41. Capacitor 40 improves high frequency stability. The output 49 is also returned through feedback resistor 55 to connection 53 on the inverting input 19. The value of this resistor controls the overall gain of the amplifier system. Since the amplifier is direct coupled, the amplifier will have a wide frequency range and low noise. It will also be economical to produce.

FIG. 2 shows a driver stage 60 and an output stage 63 which is a variation of the driver stage 14 and output stage 15 shown in FIG. 1. The driver stage 60 and output stage 63 in FIG. 2 are suitable for use with a differential input stage 12 and pre-driver stage 13 shown in FIG. 1. A positive voltage applied to the driver stage input terminal 68 will cause an increase in current in the base circuit of first transistor 61. This current will flow through first transistor 61 and resistor 64 to the negative terminal of power source 70. The increase in base current in first transistor 61 will cause an increase in its collector current. This current flows from the emitter circuit of the Darlington transistor pair 73 through the driver stage first output terminal 71 to the collector circuit of first transistor 61. The increase in emitter currents of the Darlington transistor pair 73 will cause an increase in the collector currents of the paired transistors. The collector currents of the Darlington pair 73 will flow through any load connected between grounded terminal 84 and output terminal 85. Similarly, a positive voltage applied at driver stage input terminals 69 will cause the base current of second transistor 62 to be increased. This causes the collector current of second transistor 62 to be correspondingly increased. This collector current flows from the driver stage second output terminal 72 through the base circuit of the Darlington transistor pair 74. The increase in current in the base circuit of the Darlington paired transistor 74 increases their collector currents. This collector current will flow through any load connected between output terminal 85 and grounded terminal 84. The string of diodes 79, 80, 81 and 82 interconnecting the bases of Darlington pairs 73 and 74 provide bias voltages and compensation for temperature variation of the output stage 63. Since two Darlington pairs in complementary symmetry require a greater degree of bias separation than individual transistors in complementary symmetry, four diodes are shown in FIG. 2 whereas only two diodes are shown in FIG. 1. The network composed of output inductance 86 in parallel with output resistor 87 removes any unwanted high frequencies from any load connected between output terminal 85 and grounded terminal 84. The resistor capacitor network consisting of resistor 88 and capacitor 89 maintains the output 77 near ground potential during the quiescent conditions of the amplifier.

FIG. 3 shows a driver stage 95 and an output stage 96 which is a variation of FIG. 1 and FIG. 2, but is equally suitable for operation with the differential input stage 12 and pre-driver stage 13 in FIG. 1. When a positive voltage is applied to driver stage input terminal 102, the base current of second transistor 92 is increased. The increase in base current increases the collector current of second transistors 92. This collector current flows from the emitter circuit of second transistor 92 through the driver stage second output terminal 107 and continues through diode 113 and resistor 111 to the negative terminal of power source 105. The increase in current through resistor 111 causes the bases of third and fourth transistors 93 and 94 to become more positive. As the base of fourth transistor 94 becomes more positive, the base current in fourth transistor 94 increases. This causes an increase in the collector current of fourth transistor 94, which will flow through the output capacitor 117 through any load connected between output terminal 116 and grounded terminal 121. Similarly, when a positive voltage is applied to driver stage input terminal 103, the base current of first transistor 91 is increased, causing a rise in its collector current. The collector current of first transistor 91 flows from the positive terminal of power source 104 through resistor 112, and diode 114. This current continues through driver stage first output terminal 106 to the collector of first transistor 91. The increased current through resistor 112 causes the bases of third and fourth transistors 93 and 94 to become more negative. As the base of third transistor 93 becomes more negative, the base current is increased, causing an increase in the collector current of third transistor 93. This collector current flows through the output circuit through any load connected between grounded terminal 121 and output terminal 116.

Emitter resistors 109 and 110 produce degenerative feedback which aids in the stabilization of the output stage. The output capacitor 117 blocks any DC offsets generated within the amplifier system. Diodes 113 and 114 provide base emitter bias for transistors 93 and 94, respectively. This bias level is virtually independent of the magnitude of current flow through either resistors 112 or 111. Diodes 113 and 114 also compensate for any temperature variation in third and fourth transistors 93 and 94.

The driver and output stages 130 and 131 of FIG. 4 are a variation of FIG. 1 and are compatible for use with the differential input stage 12 and the pre-driver stage 13. A positive input voltage at terminal 19 of FIG. 1 will cause the emitter current of first transistors 133 to be increased. The associated increase of collector current of the first transistor 133 increases the emitter current of the third transistor 135. This increases both the collector current out of the third transistor 135 and the emitter current of the fifth transistor 137. The result of this increased current at terminal 141 is an increase in the current through any load connected between the terminals 172 and 173.

In like manner, an increased current at terminal 140 will cause both the emitter and collector current of the second transistor 134 to be increased. This results in an increase in the emitter and collector current of the fourth transistor 136, and an increase in the emitter current of the sixth transistor 138. The final result of this increased current through terminal 140 is an increased current to a load connected between terminals 172 and 173. Diodes 156, 157, 158 and 159 produce bias voltages for transistors 135 and 136 in a similar manner as the diodes in FIGS. 1, 2 and 3. The output networks consisting of inductor 166 and shunt resistor 167 and the series resistance-capacitance network consisting of resistor 168 and capacitor 169 performs similar functions as the network described in FIG. 2. The feedback capacitor 177 adds to the stability of the amplifier system in a similar manner as capacitor 40 in FIG. 1.

In contrast to FIGS. 1, 2 and 3 the collectors of the output transistors 137 and 138 of FIG. 4 are connected to the terminal 175. Thus the disclosed invention is equally applicable to output transistors in either the emitter coupled or collector coupled configuration. In addition, the invention allows the transistors as shown to be substituted by transistors of the opposite conductivity type.

The driver and output stages as shown in FIGS. 1, 2 and 3 are all direct coupled, which enables the amplifier to have a wide power band, with low noise and distortion. In addition, the amplifier system is stable to variations in temperature and to unwanted high frequencies present at the inverting and non-inverting inputs 18 and 19.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in detains of the circuit and the combination and arrangement of circuit elements may be resorted to without departing from the spirit and scope of the invention as hereinafter claimed.

What is claimed is:

1. An amplifier system, comprising in combination,
a driver stage,
an output stage,
power source means having a first and a second power source terminal,
said driver stage including,
first and second transistors being of the same conductivity type,
first and second driver stage output means,
resistor means connecting the emitter of said first transistor only to said first power source terminal,
means directly connecting the collector of said first transistor only to said first driver stage output means,
means directly connecting the collector of said second transistor only to said second power source terminal,
resistor means connecting the emitter of said second transistor to said second drive stage output means,
means connecting a differential input to the bases of said first and second transistors,
and said output stage including,
an output,
third and fourth transistors being of a different conductivity type from one another and each having an emitter and a collector,
means connecting said collectors of said third and fourth transistors to said first and second power source terminals, respectively,
resistor means connecting said emitters of said third and fourth transistors to said output,
diode means directly interconnecting the bases of said third and fourth transistor,
and coupling means connecting said first and second driver stage output means to the bases of said third and fourth transistors resulting in said driver stage having a differential input driving said output stage consisting of push-pull complementary symmetry transistors with a single ended output.

2. An amplifier as set forth in claim 1, wherein said third transistor is one of a Darlington pair of transistors and said fourth transistor is one of a Darlington pair of transistors.

3. An amplifier as set forth in claim 1, wherein
said coupling means includes direct connections from said first and second driver stage output means to the bases of said third and fourth transistors.

4. An amplifier system as set forth in claim 3, including,
fifth and sixth transistors of the opposite conductivity type,
an output terminal,
resistive means connecting the collectors of said fifth and sixth transistors to said output terminal,
resistive means connecting the emitters of said fifth and sixth transistors to said first and second power source terminal, respectively,
means directly connecting the bases of said fifth and sixth transistors to the collectors of said third and fourth transistors, respectively,
and means interconnecting said output with said output terminal.

5. An amplifier as set forth in claim 1, wherein said diode means includes a plurality of diode means having an intermediate point, and said coupling means including means connecting said intermediate point to said first and second driver stage output means.

6. An amplifier system, comprising in combination, a differential input stage, a pre-driver stage, a driver stage, an output stage, a feedback stage, and power source means having a first and a second power source terminal, said differential input stage including;

an input having an inverting and a non-inverting terminal,

A and B transistors being of the same conductivity type, means connecting said input to the bases of said A and B transistors, resistor means connecting the emitters of said A and B transistors to said first power source terminal, said pre-driver stage including;

C and D transistors of the opposite conductivity type from said A and B transistors, resistor means connecting the emitters of said C and D transistors to said second power source terminal, means directly connecting the collectors of said A and B transistors to the bases of said C and D transistors, respectively, said driver stage including;

first and second transistors of the same conductivity type as said A and B transistors, first and second driver stage output means, resistor means connecting the emitter of said first transistor only to said first power source terminal, means connecting the collector of said first transistor only to said first driver stage output means, means connecting the collector of said second transistor only to said second power source terminal, resistor means connecting the emitter of said second transistor to said second driver stage output means, bias means for said first and second transistors, means connecting the collectors of said C and D transistors directly to the bases of said first and second transistors, respectively, said output stage including;

an output, an output terminal, third and fourth transistors being of a different conductivity type from one another, means directly connecting the collectors of said third and fourth transistors to said first and second power source terminals, respectively, resistor means connecting the emitters of said third and fourth transistors to said output, a plurality of diode means directly interconnecting the bases of said third and fourth transistors, means connecting said first and second driver stage output means to the bases of said third and fourth transistors, respectively, resulting in an complementary symmetry single ended output stage responding to an input to said differential input stage, capacitor means connecting said output to said output terminal to eliminate distortion, and said feedback stage including;

impedance means connected from said output to said inverting input terminals to control amplifier gain thereby.

* * * * *